United States Patent
Kubota et al.

(10) Patent No.: US 9,362,482 B2
(45) Date of Patent: Jun. 7, 2016

(54) METHOD OF PRODUCING PIEZOELECTRIC DEVICE USING BE, FE AND CO UNDER EXCESS OXYGEN ATMOSPHERE

(71) Applicants: Canon Kabushiki Kaisha, Ohta-ku, Tokyo (JP); Kyoto University, Kyoto-shi, Kyoto (JP); National Institute of Advanced Industrial Science and Technology, Chiyoda-ku, Tokyo (JP)

(72) Inventors: Makoto Kubota, Yokohama (JP); Kenji Takashima, Saitama (JP); Masaki Azuma, Kyoto (JP); Yoshitaka Nakamura, Kyoto (JP); Yuichi Shimakawa, Kyoto (JP); Takashi Iijima, Tsukuba (JP); Bong-Yeon Lee, Tsukuba (JP)

(73) Assignees: CANON KABUSHIKI KAISHA, Tokyo (JP); KYOTO UNIVERSITY, Kyoto (JP); NATIONAL INSTITUTE OF ADVANCED INDUSTRIAL SCIENCE & TECHNOLOGY, Tokyo (JP)

( * ) Notice: Subject to any disclaimer, the term of this patent is extended or adjusted under 35 U.S.C. 154(b) by 565 days.

(21) Appl. No.: 13/707,897
(22) Filed: Dec. 7, 2012
(65) Prior Publication Data
US 2013/0125359 A1    May 23, 2013

Related U.S. Application Data

(62) Division of application No. 12/721,131, filed on Mar. 10, 2010, now Pat. No. 8,400,047.

(30) Foreign Application Priority Data

Mar. 12, 2009   (JP) .................................. 2009-060269

(51) Int. Cl.
*B05D 5/12* (2006.01)
*H01L 41/22* (2013.01)
(Continued)

(52) U.S. Cl.
CPC ................ *H01L 41/22* (2013.01); *C04B 35/01* (2013.01); *C04B 35/26* (2013.01);
(Continued)

(58) Field of Classification Search
USPC ............................................................ 427/58
See application file for complete search history.

(56) References Cited

U.S. PATENT DOCUMENTS

| 5,985,404 A | 11/1999 | Yano et al. ................. 428/846.1 |
| 2004/0132221 A1* | 7/2004 | Kobayashi ............... B41J 2/161 438/3 |

(Continued)

FOREIGN PATENT DOCUMENTS

| JP | 2005-011931 A | 1/2005 |
| JP | 2007-221066 A | 8/2007 |

(Continued)

OTHER PUBLICATIONS

Singh et al. "Epitaxial BiFeO3 thin films fabricated by chemical solution deposition" (2006).*

(Continued)

*Primary Examiner* — Austin Murata
(74) *Attorney, Agent, or Firm* — Fitzpatrick, Cella, Harper & Scinto

(57) ABSTRACT

Provided are a bismuth-based piezoelectric material whose insulation property is improved while its performance as a piezoelectric body is not impaired and a piezoelectric device using the piezoelectric material. The piezoelectric material includes a perovskite-type metal oxide represented by the following general formula (1):

$$Bi_x(Fe_{1-y}Co_y)O_3 \qquad (1)$$

where $0.95 \leq x \leq 1.25$ and $0 \leq y \leq 0.30$, and a root mean square roughness Rq (nm) of a surface of the piezoelectric material satisfies a relationship of $0 < Rq \leq 25y+2$ ($0 \leq y \leq 0.30$).

8 Claims, 1 Drawing Sheet

(51) Int. Cl.
*C04B 35/01* (2006.01)
*C04B 35/26* (2006.01)
*H01L 41/187* (2006.01)
*H01L 41/047* (2006.01)
*H01L 41/318* (2013.01)

(52) U.S. Cl.
CPC ....... *H01L 41/0478* (2013.01); *H01L 41/1878* (2013.01); *H01L 41/318* (2013.01); *C04B 2235/3272* (2013.01); *C04B 2235/3275* (2013.01); *C04B 2235/3298* (2013.01); *C04B 2235/441* (2013.01); *C04B 2235/449* (2013.01); *C04B 2235/656* (2013.01); *C04B 2235/658* (2013.01); *C04B 2235/6585* (2013.01); *C04B 2235/768* (2013.01); *C04B 2235/787* (2013.01); *C04B 2235/963* (2013.01); *Y10T 29/42* (2015.01)

(56) References Cited

U.S. PATENT DOCUMENTS

| | | | |
|---|---|---|---|
| 2005/0017269 A1 | 1/2005 | Miyazawa et al. | 257/200 |
| 2008/0074471 A1* | 3/2008 | Sakashita | C04B 35/2683 347/68 |
| 2009/0098664 A1* | 4/2009 | Shin | H01L 21/31691 438/3 |
| 2009/0108706 A1 | 4/2009 | Okuno et al. | 310/311 |
| 2009/0220822 A1 | 9/2009 | Buehlmann et al. | 428/846 |
| 2009/0267998 A1* | 10/2009 | Sakashita | B41J 2/14233 347/68 |
| 2010/0192842 A1* | 8/2010 | Sasaki | C23C 14/08 118/50 |
| 2010/0231096 A1 | 9/2010 | Saito et al. | 310/365 |

FOREIGN PATENT DOCUMENTS

| | | |
|---|---|---|
| JP | 2007-287739 A | 11/2007 |
| JP | 2008-098627 A | 4/2008 |

OTHER PUBLICATIONS

Xu et al. "Low-temperature synthesis of $BiFeO_3$ nanopowders via a sol-gel method" (2008).*

S. Wada et al., "Preparation of [110] Grain Oriented Barium Titanate Ceramics by Templated Grain Growth Method and Their Piezoelectric Properties", *Japanese Journal of Applied Physics*, vol. 46, No. 10B, pp. 7039-7043 (2007).

* cited by examiner

METHOD OF PRODUCING PIEZOELECTRIC DEVICE USING BE, FE AND CO UNDER EXCESS OXYGEN ATMOSPHERE

RELATED APPLICATIONS

The present application is a divisional of A.N. 12/721,131, filed Mar. 10, 2010. The present application claims benefit of that application under 35 U.S.C. §120, and claims priority benefit under 35 U.S.C. §119 of Japanese Patent Application No. 2009-060269, filed Mar. 12, 2009. The entire contents of each of the mentioned prior applications are incorporated herein by reference.

BACKGROUND OF THE INVENTION

1. Field of the Invention

The present invention relates to a piezoelectric material, a piezoelectric device, and a method of producing the piezoelectric device, in particular, a lead-free piezoelectric device whose insulation property is improved by the promotion of crystallization under an excess oxygen atmosphere.

2. Description of the Related Art

A piezoelectric device is typically formed of a lower electrode and an upper electrode, and a bulk-shaped or film-shaped piezoelectric material interposed between those electrodes. As a piezoelectric material, lead-based ceramics such as lead zirconate titanate having a perovskite-type structure (hereinafter, referred to as "PZT") is generally used.

However, PZT contains lead at an A-site of a perovskite skeleton. Therefore, an effect of the lead component on the environment is considered to be a problem. In order to respond to this problem, a piezoelectric material using a lead-free perovskite-type metal oxide has been proposed.

As a typical lead-free piezoelectric material, there is exemplified BiFeO$_3$ (hereinafter referred to as "BFO") which is a perovskite-type metal oxide.

For example, Japanese Patent Application Laid-Open No. 2007-287739 discloses a BFO-based material containing lanthanum at its A-site. BFO is a good ferroelectrics, and it has been reported that the amount of remanent polarization of BFO measured at a low temperature is high, and thus is expected to have good properties as a piezoelectric material. However, there is a problem in that a voltage to be applied to BFO for producing piezoelectric distortion cannot be increased owing to low insulation property of BFO under a room-temperature environment.

In view of the foregoing, Japanese Patent Application Laid-Open No. 2007-221066 proposes a method of suppressing an increase in leak current, the method involving substituting iron as the B-site element of BFO with manganese to improve the insulation property. However, BFO whose iron atoms are partially substituted with manganese involves the problem in that a piezoelectric constant reduces.

Japanese Patent Application Laid-Open No. 2005-011931 discloses an approach to substituting the B site of BFO with Co at a ratio of 1 to 10% as an attempt to improving the ferroelectric property of a memory device using BFO. In a conventional method of producing a BFO thin film, however, the amount of undesired phases (hereinafter, referred to as "secondary phase") which are not of perovskite-type structures increases as substitution with Co progresses. Accordingly, a problem, i.e., a reduction in insulation property arises.

The present invention has been made with a view to cope with such problems, and an object of the present invention is to provide a piezoelectric material whose insulation property is improved while its performance as a piezoelectric material is not impaired.

Another object of the present invention is to provide a piezoelectric device using the piezoelectric material and a method of producing the piezoelectric device.

SUMMARY OF THE INVENTION

A piezoelectric material for solving the above problems is a piezoelectric material including a perovskite-type metal oxide represented by the following general formula (1):

$$Bi_x(Fe_{1-y}Co_y)O_3 \qquad (1)$$

where 0.95≤x≤1.25 and 0≤y≤0.30 in which a root mean square roughness Rq (nm) of a surface of the piezoelectric material satisfies a relationship of 0<Rq≤25y+2 where 0≤y≤0.30.

In addition a method of producing a piezoelectric device for solving the above problems is a method of producing a piezoelectric device having, on a substrate, a piezoelectric material and a pair of electrodes provided to contact the piezoelectric material, the method including:

forming a piezoelectric material formed of a perovskite-type metal oxide represented by the following general formula (1):

$$Bi_x(Fe_{1-y}Co_y)O_3 \qquad (1)$$

where 0.95≤x≤1.25 and 0≤y≤0.30; and crystallizing the piezoelectric material at 430° C. or lower under an excess oxygen atmosphere.

According to the present invention, there can be provided a piezoelectric material whose insulation property is improved while its performance as a piezoelectric material is not impaired.

In addition, according to the present invention, there can be provided a piezoelectric device using the piezoelectric material and a method of producing the piezoelectric device.

Further, the piezoelectric material of the present invention has no influence on an environment because the material does not use lead. In addition, the material is advantageous in terms of durability when driven as a piezoelectric device because the material does not use any alkali metal.

Further features of the present invention will become apparent from the following description of exemplary embodiments with reference to the attached drawings.

DESCRIPTION OF THE EMBODIMENTS

Figure 1:
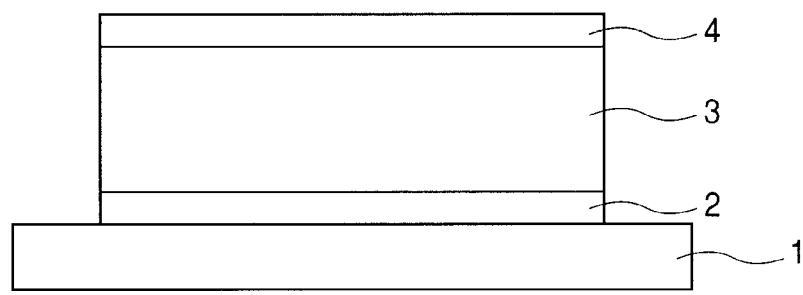
FIG. 1 is a schematic longitudinal sectional view illustrating an example of an embodiment of a piezoelectric device of the present invention.

Hereinafter, an embodiment of the present invention is described in detail. A bismuth ferrite thin film (hereinafter referred to as "BFO thin film") or bismuth ferrite cobaltate thin film (hereinafter referred to as "BFCO thin film") excellent in insulation property is described as the embodiment.

A piezoelectric material according to the present invention is a piezoelectric material formed of a perovskite-type metal oxide represented by the following general formula (1):

$$Bi_x(Fe_{1-y}Co_y)O_3 \qquad (1)$$

(In the formula, 0.95≤x≤1.25 and 0≤y≤0.30). The piezoelectric material is characterized in that the root mean square roughness Rq (nm) of the surface of the piezoelectric material satisfies a relationship of 0<Rq≤25y+2 (0≤y≤0.30). That is, the piezoelectric material of the present invention expresses a high insulation property when its surface is smooth. An upper limit for the surface roughness with which the insulation property can be maintained is determined by a function of y representing the composition amount of Co.

The metal oxide having a perovskite-type structure is generally represented by a chemical formula "ABO$_3$". The elements A and B in the perovskite-type metal oxide each act in the form of an ion to occupy a specific position of a unit cell called an A-site or a B-site. In the case of, for example, a unit cell of a cubic crystal system, the element A is positioned at a vertex of a cube, and the element B is positioned at the body center of the cube. The O elements act as oxygen anions to occupy face-centered positions.

In the general formula (1), Bi is a metal element positioned mainly at the A site, and iron and cobalt are each an element positioned mainly at the B site.

In the general formula (1), x representing the abundance of Bi satisfies a relationship of 0.95≤x≤1.25 or preferably 0.98≤x≤1.15. When x is smaller than 0.95, the insufficiency of Bi causes a defective site, thereby adversely affecting the insulation property. In contrast, when x is larger than 1.25, an excessive amount of bismuth oxide is precipitated at a crystal grain boundary, which may cause a current leak at the time of the application of a high voltage.

In the general formula (1), y representing the abundances of Fe and Co satisfies a relationship of 0≤y≤0.30. When y equals 0, the general formula (1) means a BFO thin film. One piezoelectric material provided by the present invention is a BFO thin film excellent in insulation property.

When y takes a positive value, the general formula (1) means a BFCO thin film. The present invention provides a BFCO thin film excellent in insulation property as well.

A BFCO thin film in which y further satisfies a relationship of 0.10≤y≤0.30 can be expected to show a larger piezoelectric property than that of a BFO thin film because of the size effect of Co on Fe at the B site. It should be noted that, when y exceeds 0.3, the piezoelectric property and the insulation property may be lost because the solid dissolution of Co in a perovskite skeleton becomes difficult.

Value of x and y in the piezoelectric material of the present invention can be identified by an elemental analysis approach such as energy dispersive X-ray spectroscopy (EDX), X-ray fluorescence analysis (XRF), or ICP spectrometry.

The piezoelectric material of the present invention may be doped with a trace amount of an element except Bi, Fe, and Co as long as neither its piezoelectric property nor its insulation property is impaired. Specific examples of the element that can be used as a dopant when the doping is performed include elements such as Ca, Sr, Ba, Sn, La, Th, Y, Sm, Ce, Ti, Sb, Nb, Ta, W, Mo, Cr, Ni, Cu, Si, Ge, Sc, Mg, Mn, and Zr. The doping amount of the element is 0.05 or less in terms of an atomic fraction with respect to the total number of atoms of the metal elements in the general formula (1).

Further, the piezoelectric material of the present invention has a thickness of preferably 60 nm or more to 1000 nm or less, or more preferably 60 nm or more to 500 nm or less. When the shape of the thin film is not flat and hence the thickness cannot be determined to be a single value, the average of thicknesses between two electrodes has only to be set to fall within the above range. When the thickness of the piezoelectric material of the present invention is set to 60 nm or more, a distortion amount needed for a piezoelectric device can be obtained. In addition, when the thickness is set to 1000 nm or less, an increase in density upon production of the device can be expected. In addition, the above thickness range exerts an enlarged synergistic effect with a surface roughness range to be described later.

It should be noted that the "thin film" in the specification may be of such a form as to cover one surface of a substrate, or may be of such a form that the molecules of the piezoelectric material independently agglomerate in a foil fashion.

The root mean square roughness Rq (nm) of the surface of the piezoelectric material according to the present invention is characterized by satisfying the relationship of 0<Rq≤25y+2 (0≤y≤0.30).

The "root mean square roughness Rq" in the present invention refers to one described in JIS Standard B0601 (revised edition of 2001) and is represented by the following equation:

$$Rq = \sqrt{\frac{1}{l}\int_0^l Z^2(x)dx}$$

where l represents a reference length, x represents a coordinate representing an arbitrary position, and Z(x) represents the height of a roughness curve at the coordinate x.

A method of deriving the Rq is not limited as long as the method is in conformance with the standard. For example, a method involving calculating the Rq from the height difference of the surface of the thin film scanned with an atomic force microscope (AFM) is generally adopted.

When the surface of the piezoelectric material is covered with a member such as an electrode, a root mean square height Pq of a sectional curve obtained from the sectional shape of the surface of the film may be used instead.

In the present invention, a state where the Rq of the surface of the thin film is 25y+2 or less means that the composition and fine structure of the resultant piezoelectric material are uniform irrespective of a place. Such uniform structure may be responsible for an improvement in insulation property of the piezoelectric material. As the amount of the Co component increases, the size of a crystal grain of the BFCO itself increases, and hence an allowable Rq increases.

When the Rq is 25y+2 or less, the piezoelectric material of the present invention has a sufficient insulation property. The Rq is preferably as small as possible, for example, 20y+2 or less because a higher insulation property can be expected.

The Rq necessarily takes a positive value because a crystal grain in the piezoelectric material of the present invention cannot be completely flat.

Further, the piezoelectric material of the present invention is preferably oriented toward a (100) plane or a (111) plane. When the piezoelectric material is oriented toward the (100) plane or the (111) plane, a piezoelectric deformation amount when the piezoelectric material is turned into a piezoelectric device increases because the direction of a polarization moment is aligned with the strain direction of the piezoelectric material.

The orientation state of the piezoelectric material can be easily identified from the angle at which a diffraction peak in X-ray diffractometry (such as a 2θ/θ method) generally employed for a crystalline thin film is detected and the intensity of the peak. For example, in a diffraction chart obtained from a piezoelectric material where the (100) plane or (111) plane is oriented in its thickness direction in the present invention, the intensity of a diffraction peak detected at an angle corresponding to the (100) plane or (111) plane is extremely large as compared to the total of the intensities of peaks detected at angles corresponding to the other surfaces.

Next, a piezoelectric device of the present invention is described.

The piezoelectric device according to the present invention is a piezoelectric device having, on a substrate, a piezoelectric material and a pair of electrodes provided so as to contact the piezoelectric material, the device being characterized in that the piezoelectric material is the above-mentioned piezoelectric material.

FIG. 1 is a longitudinal schematic sectional view illustrating an example of an embodiment of the piezoelectric device according to the present invention. The structure of the piezoelectric device is the same as that of conventional devices. In the figure, a substrate is represented by reference numeral 1, a lower electrode is represented by reference numeral 2, the piezoelectric material of the present invention is represented by reference numeral 3, and an upper electrode is represented by reference numeral 4.

Although there is no particular limit to a material for the substrate 1, a material that is not deformed or melted during a sintering step conducted usually at 600° C. or less is preferred. For example, a single crystal substrate made of magnesium oxide (MgO), strontium titanate (SrTiO$_3$), or the like, a ceramic substrate made of zirconia (ZrO$_2$), alumina (Al$_2$O$_3$), silica (SiO$_2$), or the like, a semiconductor substrate made of silicon (Si), tungsten (W), or the like, or a heat-resistant stainless (SUS) substrate is preferably used. Multiple kinds of those materials may be combined or those materials may be stacked to form a multi-layer structure.

Of the materials for substrate 1 described above, most preferable one is a single crystal substrate of strontium titanate. When strontium titanate, which is a perovskite-type metal oxide, is used for the substrate 1, crystallinity of the piezoelectric material 3 made of the same perovskite-type metal oxide increases and piezoelectric property and driving durability of the piezoelectric device is improved.

One of a conductive metal and a conductive metal oxide may be doped in a substrate or stacked on the surface of a substrate for the purpose of allowing one of the conductive metal and the conductive metal oxide to additionally function as one of the electrodes of the piezoelectric device. For example, when the substrate made of strontium titanate is doped with Niobium (Nb) or Lanthanum (La), conductivity of the substrate increases. As a result, the substrate also serves as an electrode.

The substrate used in the piezoelectric device of the present invention is preferably a single crystal substrate oriented toward a (100) plane or a (111) plane out of those substrates.

The use of a single crystal substrate oriented toward a specific plane can strongly orient the piezoelectric material provided for the surface of the substrate in the same azimuth. When the piezoelectric material is oriented toward the (100) plane or the (111) plane, the improvement of a piezoelectric effect can be expected because a polarization moment is aligned with the direction perpendicular to the film.

The lower electrode 2 and the upper electrode 4 are each formed of a conductive layer having a thickness of about 5 to 2,000 nm. A material for each of the electrodes is not particularly limited, and a material used in a piezoelectric device in ordinary cases suffices. Examples of the material include metals such as Ti, Pt, Ta, Ir, Sr, In, Sn, Au, Al, Fe, Cr, and Ni, and oxides of those metals. Each of the lower electrode 2 and the upper electrode 4 may be formed of one of them, or may be formed by laminating two or more kinds of them.

Further, at least one of the lower electrode 2 and the upper electrode 4 is preferably formed of M1RuO$_3$ (M1 represents at least one selected from the group consisting of Sr, Ba, and Ca).

The M1RuO$_3$ is each a conductive oxide having a perovskite-type structure. When those oxides are applied to the lower electrode 2 or the upper electrode 4, the consistency of crystal lattices at a contact interface with the piezoelectric material 3 is improved, and hence improvements in piezoelectric property and driving durability of the piezoelectric device can be expected.

In particular, when the lower electrode 2 is formed of the conductive oxide, the electrode serves to promote the crystallization of the piezoelectric material 3 into a perovskite-type structure, and hence improvements in insulation property and piezoelectric property of the piezoelectric device can be expected.

The most preferred electrode material is SrRuO$_3$ from the viewpoints of the conductivity of an electrode and the promotion of the crystallization of the piezoelectric material.

The lower electrode 2 and the upper electrode 4 may each be formed by application or baking by a liquid phase film-forming method such as a chemical solution deposition method, or by a vapor phase film-forming method such as pulse lasering, sputtering, or vapor deposition. In addition, each of the lower electrode 2 and the upper electrode 4 may be used after having been patterned into a desired shape.

The piezoelectric material 3 may similarly be used in the device after having been patterned into a desired shape.

The piezoelectric device of the present invention can be used in a device such as a piezoelectric sensor, an ultrasonic vibrator, a piezoelectric actuator, an ink-jet head, a ferroelectric memory, or a capacitor.

Next, a method of producing a piezoelectric device of the present invention is described.

The method of producing a piezoelectric device according to the present invention is a method of producing a piezoelectric device having a piezoelectric material on a substrate provided with electrodes, the method being characterized by including forming a perovskite-type metal oxide represented by the following general formula (1):

$$Bi_x(Fe_{1-y}Co_y)O_3 \qquad (1)$$

(In the formula, $0.95 \leq x \leq 1.25$ and $0 \leq y \leq 0.30$), and crystallizing the piezoelectric material at 430° C. or lower under an excess oxygen atmosphere.

The term "excess oxygen atmosphere" as used in the present invention refers to an atmosphere having a higher oxygen concentration than that of an ordinary air atmosphere such as an atmosphere having an oxygen concentration in a reactor of 21 vol % or more, or preferably 25 vol % or more. Crystallization in a state where an oxygen gas is flowed into the reactor, crystallization in a state where a gas mixed with oxygen is flowed into the reactor, or the like is suitably applicable to the crystallization under the excess oxygen atmosphere.

The substrate is the same as that in the piezoelectric device of the present invention, and a material for the substrate is not particularly limited. The substrate is most preferably a single crystal substrate selectively oriented toward a (100) plane or a (111) plane. The most preferable material for the substrate 1 is a single crystal substrate of strontium titanate.

The use of a single crystal substrate oriented toward a specific plane exerts a promoting action on the crystallization of each of a first electrode and the piezoelectric material provided on the substrate.

The first electrode is an electrode on a substrate side out of the pair of electrodes of which the piezoelectric device of the present invention is formed. In such embodiment as illustrated in FIG. 1, the first electrode corresponds to the lower electrode 2. Similarly, a second electrode corresponds to the upper electrode 4 in FIG. 1.

A piezoelectric device is produced by stacking the first electrode, the piezoelectric material, and the second electrode in the stated order on the substrate. As a result, a piezoelectric device having good adhesiveness between members can be produced.

The term "chemical solution deposition method" as used in the present invention refers to a generic name for film-forming methods each involving applying a precursor solution for a target metal oxide onto a substrate, and crystallizing the applied solution under heat to provide the target metal oxide. In general, film-forming methods called a CSD method, a sol-gel method, and a metalorganic decomposition method are included in the term, and are hereinafter generically referred to as chemical solution deposition methods. The chemical solution deposition methods are each a film-forming method excellent in precision control of metal composition.

A precursor solution of a metal oxide applied onto the substrate contains at least Bi, Fe, and Co. Those metal elements are incorporated into the precursor solution in the form of a hydrolyzable or thermally-degradable organometallic compound. For example, typical examples thereof include metal complexes of the metals such as a metal alkoxide, organic acid salt, and β-diketone complex. As the metal complex, in addition to amine complexes, there may be used various other complexes. Examples of the β-diketone include acetylacetone (=2,4-pentanedione), heptafluorobutanoylpivaloylmethane, dipivaloylmethane, trifluoroacetylacetone, and benzoylacetone.

In the method of producing a piezoelectric device of the present invention, of the organometallic compounds, at least bismuth 2-ethylhexanoate, tris(acetylacetonato)iron, and tris(acetylacetonato)cobalt are preferably incorporated into the precursor solution.

Those organometallic compounds qualify for the production of a piezoelectric material at a low temperature because the compounds are excellent in mutual solubility and the volatilization temperatures of organic components in the compounds are low. Accordingly, the use of those organometallic compounds in the precursor solution can provide a piezoelectric material having a small amount of secondary phases and excellent in insulation property.

Further, a difference between the total content of Fe and Co in the precursor solution and the content of Bi in the solution is preferably 1 mol % or less. That is, the foregoing intends to make the loading amount of Bi to be positioned at the A site of the perovskite skeleton and the loading amount of Fe and Co to be positioned at the B site of the skeleton comparable to each other. With such procedure, the charge balance of the piezoelectric material to be finally obtained is established, and hence the insulation property is improved. In addition, the procedure has such an action that the arrangement of perovskite-type crystals is promoted and hence the amount of the secondary phases is reduced. This is attributable to a feature of the chemical solution deposition method in which the arrangement of metal atoms in an intermediate state before crystallization affects the arrangement of the metal atoms after the crystallization.

The organometallic compounds as precursors for the respective component metals are collectively dissolved or dispersed in a proper solvent. Thus, a precursor solution for a composite organic metal oxide (oxide containing two or more metals) of which the piezoelectric material is formed is prepared. In addition, the solvent used in the preparation of the precursor solution is appropriately selected from various known solvents in consideration of dispersibility and an application property.

Examples of the solvent used for preparing the precursor solution include a toluene-based solvent, an alcohol-based solvent, an ether-based solvent, a cellosolve-based solvent, an amide-based solvent, and a nitrile-based solvent. Of those, the toluene-based solvent is preferably used. The amount of the solvent contained in the precursor solution of the present invention is not particularly limited. However, a dense piezoelectric material is easily obtained when the amount of the solvent is adjusted so that the concentration of a metal oxide component converted to the chemical formula represented by the general formula (1) falls within the range of about 0.5 mol/Kg to 5 mol/Kg.

The precursor solution may contain an additive such as a stabilizer in addition to the organometallic compound and solvent. Examples of the stabilizer include β-diketones, ketone acids, lower alkyl esters of those ketone acids, oxyacids, lower alkyl esters of those oxyacids, oxyketones, α-amino acids, and alkanolamines.

The precursor solution is applied onto the first electrode. A known application method such as spin coating, dip coating, bar coating, or spray coating can be employed as a method of applying the precursor solution. A relative humidity in this case is preferably 60% or less. A relative humidity of more than 60% is not preferred because hydrolysis progresses rapidly in the applied raw material solution on the substrate and hence a precipitate is observed in the applied layer in some cases.

The number of times of application is determined by a relationship between a coating thickness and a desired thickness of the piezoelectric material. It should be noted that the application is performed multiple times in the chemical solution deposition method of the present invention, and a coating thickness per layer is preferably 8 nm or more to 30 nm or less. The microstructure of a metal oxide thin film obtained by the chemical solution deposition method is largely affected by the coating thickness per layer. In the present invention, when the coating thickness is set to fall within the above range so that the film may be of a stacked structure, the film becomes dense and uniform. As a result, the uniformization of crystal phases and an improving effect on the insulation property can be obtained to an additionally large extent.

The chemical solution deposition method is performed by multi-layer coating. The term "multi-layer" refers to two or more layers, or preferably 5 or more to 35 or less layers.

When the application is performed multiple times, a drying step is more preferably performed during each time period between application and the next application. Although the drying step may serve also as the step of crystallizing the piezoelectric material, the step is preferably performed at a low temperature involving no crystallization, for example, 300° C. or lower. A dryer, hot plate, tubular furnace, electric furnace, or the like can be used in the drying step.

The crystallization of the piezoelectric material in the present invention is performed at a maximum temperature of 430° C. or lower under an excess oxygen atmosphere. A lower limit for the crystallization temperature, which varies depending on the composition of the piezoelectric material, is typically 400° C. or higher.

The crystallization of the piezoelectric material at a temperature within the above range can suppress the emergence of secondary phases that are of non-perovskite-type structures and hence have non-piezoelectric properties. In addition, the crystallization of the piezoelectric material at a temperature within the above range uniformizes the growth of crystal grains, thereby providing a piezoelectric material having a smooth film surface.

In addition, when heating is performed under the excess oxygen atmosphere, the crystallization of the piezoelectric material is promoted even in a low temperature region with a maximum of 430° C. or lower. As described above, the term "excess oxygen atmosphere" as used in the present invention refers to an atmosphere having a higher oxygen concentration than that of an ordinary air atmosphere. For example, the excess oxygen atmosphere can be obtained by introducing an oxygen gas supplied from a bomb into an electric furnace where the crystallization is performed.

An ozone component is more preferably incorporated into the excess oxygen atmosphere for further promoting the crystallization of the piezoelectric material. The term "ozone component" includes an ozone gas, an ozone ion, and an ozone radical. Since the ozone component has higher oxidizing power than that of oxygen, the ozone component has an effect in which the amount of the secondary phases of the piezoelectric material is reduced so that the insulation property and piezoelectric property of the piezoelectric device may be improved. The excess oxygen atmosphere containing the ozone component can be easily obtained by using the oxygen gas and a commercially available, industrial ozone generator or the like.

A tubular furnace, electric furnace, infrared oven, hot plate, or the like can be used in the crystallizing step. Of those, the tubular furnace is suitable for the introduction of the excess oxygen atmosphere.

Hereinafter, the present invention is described more specifically by way of examples. However, the present invention is not limited by the following examples.

Production Examples 1 to 4 of Precursor Solution

Mixed solutions having metal molar ratios shown in Table 1 were each prepared as a precursor solution for forming the piezoelectric material and piezoelectric device of the present invention.

For preparing the precursor solution, there were mixed a toluene solution of bismuth 2-ethylhexanoate, a toluene solution of tris(acetylacetonato)iron, and a toluene solution of tris(acetylacetonato)cobalt, each having a concentration of 0.2 mol/Kg. The mixed solution was heated and refluxed for 1 hour at 120° C. under a nitrogen atmosphere to promote the progress of a thermolysis reaction. Toluene was added to the resultant so that the concentration of the oxides as BFO or BFCO might be 0.2 mol/Kg, to thereby obtain a precursor solution.

The precursor solutions of Production Examples 1 to 4 each had a difference between the total concentration of Fe and Co components and the concentration of Bi of 1 mol % or less.

Production Examples 5 to 8 of Precursor Solution

Precursor solutions having metal molar ratios shown in Table 1 were each prepared in the same manner as in Production Example 1 for comparison with the present invention.

TABLE 1

|  | Bi(mol) | Fe(mol) | Co(mol) |
| --- | --- | --- | --- |
| Production Example 1 | 100 | 100 | 0 |
| Production Example 2 | 100 | 90 | 10 |
| Production Example 3 | 100 | 80 | 20 |
| Production Example 4 | 100 | 70 | 30 |
| Production Example 5 | 100 | 60 | 40 |
| Production Example 6 | 100 | 0 | 100 |
| Production Example 7 | 80 | 100 | 0 |
| Production Example 8 | 130 | 90 | 10 |

Production Examples of Substrate and First Electrode

A substrate and a first electrode each having a structure shown in Table 2 were prepared for forming the piezoelectric device of the present invention. In the table, an $SrRuO_3$ electrode is an electrode provided by a pulse laser film-forming method and having a thickness of about 100 nm, and a Pt electrode is an electrode provided by a sputtering deposition method and having a thickness of about 200 nm.

TABLE 2

|  | Substrate | First electrode |
| --- | --- | --- |
| Substrate A with electrodes | (100)-oriented, Nb-doped $SrTiO_3$ single crystal | Shared with substrate |
| Substrate B with electrodes | (111)-oriented, Nb-doped $SrTiO_3$ single crystal | Shared with substrate |
| Substrate C with electrodes | (100)-oriented $SrTiO_3$ single crystal | (100)-oriented $SrRuO_3$ film |
| Substrate D with electrodes | (111)-oriented $SrTiO_3$ single crystal | (111)-oriented $SrRuO_3$ film |
| Substrate E with electrodes | Silicon substrate with $SiO_2$ oxide film | Pt film |

Example 1

A perovskite-type metal oxide thin film was formed by a chemical solution deposition method using the precursor solution of Production Example 1 shown in Table 1 and the substrate A with electrodes shown in Table 2.

First, the precursor solution was applied to the surface of the substrate with a spin coater (3000 rpm). The applied layer was heat-treated at 250° C. for 5 minutes so that the solvent might be dried. The heat treatment process was performed with an electric dryer under an air atmosphere.

Hereinafter, in the same manner as in the foregoing, the applying step and the drying step were repeated so that second to twentieth layers might be formed. Finally, the entire substrate having the multiple applied layers was placed in an infrared-annealing tubular furnace. An oxygen gas was introduced into the tubular furnace at a flow rate of 1 L/min (corresponding to an oxygen concentration in the furnace of 50 to 80 vol %), and furthermore, a heat treatment was performed at 430° C. for 60 minutes so that the film might be crystallized. As a result, the piezoelectric material of the present invention was obtained.

X-ray diffraction measurement (XRD) found that the piezoelectric material had a rhombohedral perovskite-type structure selectively oriented toward a (100) plane. The thickness of the piezoelectric material measured with a contact displacement meter was 250 nm. That is, a coating thickness per layer is 12.5 nm.

Next, the content of a metal element in the piezoelectric material was measured by X-ray fluorescence analysis (XRF). It was found that, when the total molar amount of iron and cobalt was normalized to 1, a content ratio "Bi/Fe/Co" was 1.00/1.00/0.00.

The surface of the piezoelectric material was scanned with an atomic force microscope (AFM) so that the image of crystal grains might be obtained. A root mean square roughness Rq corresponding to JIS Standard B0601 calculated from a height difference in a 2000-nm square image was 1.19 nm.

Examples 2 to 18

The piezoelectric materials of the present invention were each formed in the same manner as in Example 1 except that the precursor solution, the substrate with electrodes, the crystallization atmosphere, and the crystallization temperature were changed. Table 3 shows the production conditions of each example.

In each of Examples 17 and 18, an ozone-containing oxygen atmosphere was used as the crystallization atmosphere. The atmosphere was established by introducing an oxygen gas, which had passed through a commercially available ozone generator, at a flow rate of 1 L/min into the tubular furnace. It should be noted that the concentration at which the ozone generator generated ozone was about 100 g/m$^3$.

XRD showed that those piezoelectric materials each had a rhombohedral perovskite-type structure. The amount of secondary phases except the perovskite-type structure was extremely small. In addition, the shift of a peak position in XRD confirmed that a BFCO thin film in which y took a positive value had Co introduced into a perovskite skeleton.

Further, each piezoelectric material was evaluated for its orientation, thickness measured with a contact displacement meter, abundance ratio among metal elements determined by XRF, and root mean square roughness Rq measured with an AFM. The results are as shown in Table 4.

Comparative Examples 1 to 10

Composite oxide thin films for comparison were formed in the same manner as in the examples by using the precursor solutions of Production Examples 1 to 8 shown in Table 1 and the substrates A, B, and E with electrodes shown in Table 2.

Comparative Examples 1 to 4 were each a film crystallized under an excess oxygen atmosphere at 600° C., and XRD showed that the films each had a rhombohedral perovskite-type structure, though the amount of secondary phases was large.

Comparative Example 5 was a film crystallized under an air atmosphere at 430° C. and Comparative Example 6 was a film crystallized under an excess nitrogen atmosphere at 430° C. XRD showed that the films each had a larger amount of secondary phases caused by non-perovskite-type crystals than those of the films of Comparative Examples 1 to 4 described above, though the films each had a rhombohedral perovskite-type structure.

In the XRD chart of each of Comparative Examples 7 to 10 where the precursor solution was changed, the amount of secondary phases was so large that it was no longer easy to say that a perovskite-type structure was dominant. In addition, no such peak shift that Co was introduced into a perovskite skeleton was observed in Comparative Examples 7, 8, and 10 in each of which y took a positive value.

The composite oxide thin films of Comparative Examples 1 to 6 which seemed to be such perovskite-type metal oxides as represented by the general formula (1) were each evaluated for its orientation, thickness, abundance ratio among metal elements, and root mean square roughness Rq in the same manner as in the examples. The results are as shown in Table 4.

TABLE 3

| | Precursor solution | Substrate with electrodes | Number of coats | Atmosphere | Crystallization temperature |
|---|---|---|---|---|---|
| Example 1 | Production Example 1 | A | 20 layers | Oxygen flow | 430° C. |
| Example 2 | Production Example 2 | A | 20 layers | Oxygen flow | 430° C. |
| Example 3 | Production Example 3 | A | 20 layers | Oxygen flow | 430° C. |
| Example 4 | Production Example 4 | A | 20 layers | Oxygen flow | 430° C. |
| Example 5 | Production Example 1 | B | 5 layers | Oxygen flow | 420° C. |
| Example 6 | Production Example 2 | B | 5 layers | Oxygen flow | 420° C. |
| Example 7 | Production Example 3 | B | 5 layers | Oxygen flow | 420° C. |
| Example 8 | Production Example 4 | B | 5 layers | Oxygen flow | 420° C. |
| Example 9 | Production Example 1 | C | 20 layers | Oxygen flow | 430° C. |
| Example 10 | Production Example 2 | C | 20 layers | Oxygen flow | 430° C. |
| Example 11 | Production Example 3 | C | 20 layers | Oxygen flow | 430° C. |
| Example 12 | Production Example 4 | C | 20 layers | Oxygen flow | 430° C. |
| Example 13 | Production Example 1 | D | 5 layers | Oxygen flow | 410° C. |
| Example 14 | Production Example 3 | D | 30 layers | Oxygen flow | 430° C. |
| Example 15 | Production Example 1 | E | 15 layers | Oxygen flow | 430° C. |
| Example 16 | Production Example 2 | E | 15 layers | Oxygen flow | 430° C. |
| Example 17 | Production Example 3 | A | 20 layers | Ozone-containing oxygen | 430° C. |
| Example 18 | Production Example 4 | A | 20 layers | Ozone-containing oxygen | 430° C. |
| Comparative Example 1 | Production Example 1 | A | 20 layers | Oxygen flow | 600° C. |
| Comparative Example 2 | Production Example 2 | A | 20 layers | Oxygen flow | 600° C. |
| Comparative Example 3 | Production Example 3 | A | 20 layers | Oxygen flow | 600° C. |
| Comparative Example 4 | Production Example 4 | A | 20 layers | Oxygen flow | 600° C. |
| Comparative Example 5 | Production Example 1 | B | 5 layers | Air | 430° C. |
| Comparative Example 6 | Production Example 3 | B | 5 layers | Nitrogen flow | 430° C. |
| Comparative Example 7 | Production Example 5 | A | 20 layers | Oxygen flow | 430° C. |
| Comparative Example 8 | Production Example 6 | A | 20 layers | Oxygen flow | 430° C. |
| Comparative Example 9 | Production Example 7 | E | 20 layers | Oxygen flow | 430° C. |
| Comparative Example 10 | Production Example 8 | B | 20 layers | Oxygen flow | 430° C. |

TABLE 4

| | Orientation | Thickness (nm) | x(Bi) | 1-y (Fe) | y (Co) | 25y + 2 | Rq/nm |
|---|---|---|---|---|---|---|---|
| Example 1 | (100) | 250 | 1.00 | 1.00 | 0.00 | 2.00 | 1.19 |
| Example 2 | (100) | 300 | 1.00 | 0.90 | 0.10 | 4.50 | 1.96 |
| Example 3 | (100) | 340 | 1.00 | 0.80 | 0.20 | 7.00 | 6.51 |
| Example 4 | (100) | 350 | 1.00 | 0.70 | 0.30 | 9.50 | 5.44 |
| Example 5 | (111) | 70 | 1.00 | 1.00 | 0.00 | 2.00 | 1.72 |
| Example 6 | (111) | 95 | 1.00 | 0.90 | 0.10 | 4.50 | 3.15 |
| Example 7 | (111) | 100 | 1.05 | 0.80 | 0.20 | 7.00 | 5.11 |
| Example 8 | (111) | 100 | 1.05 | 0.70 | 0.30 | 9.50 | 8.23 |
| Example 9 | (100) | 240 | 0.98 | 1.00 | 0.00 | 2.00 | 1.50 |
| Example 10 | (100) | 290 | 1.00 | 0.90 | 0.10 | 4.50 | 2.16 |
| Example 11 | (100) | 300 | 1.00 | 0.80 | 0.20 | 7.00 | 4.44 |
| Example 12 | (100) | 320 | 1.00 | 0.70 | 0.30 | 9.50 | 6.58 |
| Example 13 | (111) | 60 | 1.00 | 1.00 | 0.00 | 2.00 | 1.66 |
| Example 14 | (111) | 550 | 1.00 | 0.80 | 0.20 | 7.00 | 4.71 |
| Example 15 | Random | 210 | 1.10 | 1.00 | 0.00 | 2.00 | 1.88 |
| Example 16 | Random | 230 | 1.15 | 0.90 | 0.10 | 4.50 | 3.99 |
| Example 17 | (100) | 320 | 1.00 | 0.80 | 0.20 | 7.00 | 3.24 |
| Example 18 | (100) | 340 | 0.95 | 0.70 | 0.30 | 9.50 | 3.91 |
| Comparative Example 1 | Weakly (100) | 270 | 1.00 | 1.00 | 0.00 | 2.00 | 6.43 |
| Comparative Example 2 | Random | 320 | 1.03 | 0.91 | 0.09 | 4.25 | 5.15 13.6 |
| Comparative Example 3 | Random | 400 | 1.02 | 0.81 | 0.19 | 6.75 | |
| Comparative Example 4 | Random | 420 | 1.31 | 0.75 | 0.25 | 8.25 | 10.3 |
| Comparative Example 5 | Weakly (111) | 400 | 0.93 | 1.00 | 0.00 | 2.00 | 4.05 |
| Comparative Example 6 | Random | 420 | 1.00 | 0.80 | 0.20 | 7.00 | 8.25 |

Production of Devices from Examples 1 to 4, 9 to 12, and 17

A platinum electrode having a diameter of 120 nm was provided on the surface of each of the piezoelectric materials of Examples 1 to 4, 9 to 12, and 17 by a sputtering deposition method. As a result, the piezoelectric devices of the present invention were produced.

Production of Devices from Comparative Examples 1 to 4

A platinum electrode having a diameter of 120 µm was provided on the surface of each of the composite oxide thin films of Comparative Examples 1 to 4 by a sputtering deposition method. As a result, devices for comparison were produced.

Neither of the composite oxide thin films of Comparative Examples 5 and 6 was turned into a device because each of the films showed a tester leak.

(Evaluation by Electric Measurement)

Electric measurement was conducted on the piezoelectric devices of Examples 1 to 4, 9 to 12, and 17, and the devices of Comparative Examples 1 to 4. Each of the devices was measured for values representing the properties of a piezoelectric device at room temperature (25° C.), i.e., a leak current, P-E hysteresis, and a piezoelectric constant. The results thereof are shown in Table 5.

The leak current was determined by measuring a leak current in such a range that an applied voltage per thickness of a thin film sandwiched between electrodes was ±2000 kV/cm, to thereby record the maximum leak current.

P-E hysteresis measurement was performed for judging whether or not a device of interest had ferroelectricity and an insulation property. A material having ferroelectricity has a piezoelectric property. In other words, the hysteresis of spontaneous polarization when an external electric field with its intensity changed positive and negative was applied to the piezoelectric device of the present invention or a device for comparison was observed. The case where a hysteresis curve peculiar to a ferroelectrics in which the spontaneous polarization was inverted was observed was marked with ○ in Table 5. The case where the device of interest was poor in insulation property and hence no ferroelectricity curve was observed was marked with x.

A piezoelectric constant was approximately determined with a laser Doppler velocimeter. In other words, the distortion of a piezoelectric material when an applied voltage per thickness of a thin film sandwiched between electrodes ranged from 0 to +4000 kV/cm was observed with the velocimeter. The piezoelectric constant shown in Table 5 was calculated from a gradient when the distortion curve was linearly approximated. The case where a device had a low insulation property and hence the above voltage could not be applied was marked with x.

TABLE 5

| | Leak current (A/cm2) | Ferroelectricity | Piezoelectric constant d33 (pm/V) |
|---|---|---|---|
| Example 1 | $9.3 \times 10^{-5}$ | ○ | 36 |
| Example 2 | $1.9 \times 10^{-4}$ | ○ | 49 |
| Example 3 | $2.8 \times 10^{-4}$ | ○ | 51 |
| Example 4 | $3.1 \times 10^{-4}$ | ○ | 53 |
| Example 9 | $4.0 \times 10^{-5}$ | ○ | 35 |
| Example 10 | $5.1 \times 10^{-5}$ | ○ | 52 |
| Example 11 | $1.1 \times 10^{-4}$ | ○ | 70 |
| Example 12 | $1.4 \times 10^{-4}$ | ○ | 72 |
| Example 17 | $9.5 \times 10^{-5}$ | ○ | 63 |
| Comparative Example 1 | $8.0 \times 10^{-1}$ | x | x |
| Comparative Example 2 | $2.7 \times 10^{-0}$ | x | x |
| Comparative Example 3 | $4.1 \times 10^{-0}$ | x | x |
| Comparative Example 4 | $4.0 \times 10^{-0}$ | x | x |

According to Table 5, the piezoelectric devices of the present invention were each excellent in insulation property, and each showed ferroelectricity and a piezoelectric property in a room temperature region while the devices for comparison were each poor in insulation property, and hence a ferroelectric property and a piezoelectric constant could not be observed in the room temperature region. It should be noted that, in the P-E hysteresis measurement at −190° C. where a leak current was artificially suppressed, the devices of Comparative Examples 1 and 2 each showed a ferroelectricity curve as in the case of the piezoelectric devices of all examples.

Figure 2:
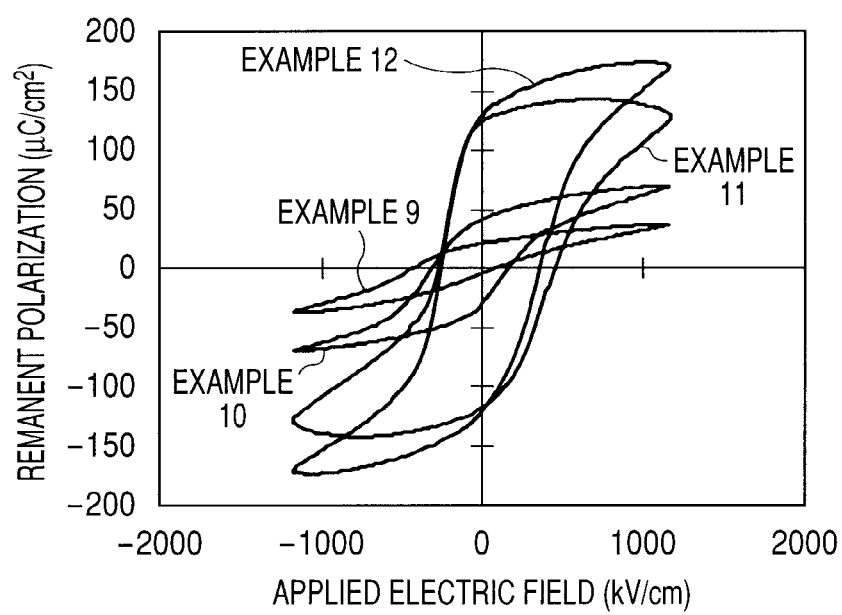
FIG. 2 is a graph illustrating the P-E hysteresis curves of piezoelectric devices produced in examples of the present invention.

FIG. 2 illustrates P-E hysteresis curves when a maximum electric field of ±1000 kV/cm was applied to the piezoelectric devices of Examples 9 to 12. FIG. 2 and the results of Table 5 show that the piezoelectric device of the present invention has an excellent piezoelectric property and an excellent ferroelectric property when y is 0.1 or more.

According to the present invention, there can be provided a piezoelectric material whose insulation property is improved while its performance as a piezoelectric body is not impaired. The piezoelectric material of the present invention is also applicable to an MEMS technique and is clean to the environment. Therefore, the piezoelectric material of the present invention can be used for appliances using many ferroelectric materials and piezoelectric materials, such as a ferroelectric memory, a thin film piezo-type ink jet head, and an ultrasonic motor without difficulty.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A method of producing a piezoelectric device comprising a substrate bearing a piezoelectric material and a pair of electrodes provided to contact the piezoelectric material, the method comprising:

subjecting a raw material comprising Bi, Fe and Co to a heat treatment at 430° C. or lower under an atmosphere comprising at least 25 vol % oxygen to obtain a piezoelectric material formed of a perovskite-type metal oxide represented by formula (1):

$$Bi_x(Fe_{1-y}Co_y)O_3 \quad (1)$$

where 0.95≤x≤1.25 and 0.10≤y≤0.30.

2. The method of producing a piezoelectric device according to claim 1, wherein the piezoelectric material is formed by a chemical solution deposition method.

3. The method of producing a piezoelectric device according to claim 1, wherein the atmosphere comprises ozone.

4. The method of producing a piezoelectric device according to claim 2, wherein the chemical solution deposition method is performed by multi-layer coating at a coating thickness per layer of from 8 nm to 30 nm.

5. The method of producing a piezoelectric device according to claim 1, wherein the substrate comprises a single crystal substrate oriented toward one of a (100) plane and a (111) plane.

6. The method of producing a piezoelectric device according to claim 2, wherein a precursor solution used in the chemical solution deposition method comprises bismuth 2-ethylhexanoate, tris(acetylacetonato)iron, and tris(acetylacetonato)cobalt.

7. The method of producing a piezoelectric device according to claim 6, wherein a difference between a total content of Fe and Co in the precursor solution and a content of Bi in the solution is 1 mol % or less.

8. The method of producing a piezoelectric device according to claim 1, wherein the electrodes each comprise either (i) M1RuO₃ where M1 represents at least one member selected from the group consisting of Sr, Ba, and Ca or (ii) $Sr_{(1-z)}M2_zCoO_3$ where M2 represents at least one member selected from the group consisting of La, Pr, Sm, and Nd, and z satisfies a relationship of 0≤z<1.

* * * * *